US010269696B2

(12) United States Patent
Vreman et al.

(10) Patent No.: US 10,269,696 B2
(45) Date of Patent: Apr. 23, 2019

(54) FLEX CIRCUIT FOR ACCESSING PINS OF A CHIP CARRIER

(71) Applicant: Intel Corporation, Santa Clara, CA (US)

(72) Inventors: Gerrit John Vreman, Shingle Springs, CA (US); Animesh Mishra, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 14/965,831

(22) Filed: Dec. 10, 2015

(65) Prior Publication Data
US 2017/0170098 A1 Jun. 15, 2017

(51) Int. Cl.
H01R 9/00 (2006.01)
H01L 23/498 (2006.01)
H01L 21/48 (2006.01)
H01L 21/66 (2006.01)
H05K 1/02 (2006.01)
H05K 1/11 (2006.01)

(52) U.S. Cl.
CPC ...... *H01L 23/4985* (2013.01); *H01L 21/4853* (2013.01); *H01L 22/32* (2013.01); *H01L 23/49822* (2013.01); *H01L 23/49833* (2013.01); *H01L 23/49838* (2013.01); *H05K 1/0268* (2013.01); *H05K 1/118* (2013.01); *H01L 2224/48091* (2013.01); *H01L 2224/48227* (2013.01); *H01L 2224/73265* (2013.01); *H01L 2924/14* (2013.01); *H01L 2924/1579* (2013.01); *H01L 2924/15311* (2013.01); *H01L 2924/15787* (2013.01); *H01L 2924/181* (2013.01); *H05K 2201/0397* (2013.01); *H05K 2201/09063* (2013.01); *H05K 2201/10734* (2013.01); *H05K 2203/162* (2013.01)

(58) Field of Classification Search
CPC ................ H01L 21/4853; H01L 22/14; H01L 23/49822; H01L 23/49833; H01L 23/49838; H01L 23/4985; H05K 3/3436
See application file for complete search history.

(56) References Cited

U.S. PATENT DOCUMENTS 5,403,784 A * 4/1995 Hashemi ............. H01L 21/4842
257/E23.042
5,982,018 A * 11/1999 Wark ...................... H01L 23/13
257/532

(Continued)

Primary Examiner — Yuriy Semenenko
(74) Attorney, Agent, or Firm — Schwabe, Williamson & Wyatt, P.C.

(57) ABSTRACT

Flexible circuits mountable in a standoff region between a chip carrier, e.g., a ball grid array (BGA) component, and a printed circuit board (PCB) of a surface-mount package are described. In an example, a flexible circuit includes holes to receive pins, e.g., solder balls, of the BGA component, and one or more conductive leads electrically connected to respective solder balls within the holes. The conductive leads may interconnect several solder balls within the standoff region, and may be electrically accessible through a test pad located laterally outward from the standoff region. Electrical signals may be monitored or driven through the test pad, and thus, the flexible circuit may be used as a debug tool for detecting and or correcting a design fault of the surface-mount package.

20 Claims, 11 Drawing Sheets

(56) References Cited

U.S. PATENT DOCUMENTS

| | | | | |
|---|---|---|---|---|
| 5,987,744 A | * | 11/1999 | Lan | H01L 21/4857 |
| | | | | 216/18 |
| 6,400,019 B1 | * | 6/2002 | Hirashima | H01L 23/49816 |
| | | | | 257/737 |
| 2003/0153099 A1 | * | 8/2003 | Jiang | H01L 23/3737 |
| | | | | 438/1 |
| 2004/0070084 A1 | * | 4/2004 | Kuramoto | H01L 21/4853 |
| | | | | 257/779 |
| 2011/0049710 A1 | * | 3/2011 | Kao | H01L 23/49838 |
| | | | | 257/738 |
| 2017/0106986 A1 | * | 4/2017 | Sweeny | B64C 25/58 |

* cited by examiner

A - A

FLEX CIRCUIT FOR ACCESSING PINS OF A CHIP CARRIER

TECHNICAL FIELD

Embodiments described herein generally relate to the field of surface-mount packages and, in particular, circuit components mountable between a chip carrier and a printed circuit board of a surface-mount package.

BACKGROUND

Chip carriers are surface-mount packaging components used to support and connect integrated circuits to printed circuit boards (PCBs). A ball grid array (BGA) component is a common form factor of a chip carrier. A BGA component include a pin array that can be connected to PCB contact pads. When a BGA component is mounted on a PCB, the BGA component and the PCB are usually separated by a narrow space, e.g., a gap on the order of 250 micron. Thus, pins of the pin array ordinarily cannot be accessed through the gap. To access pins of the pin array after mounting, a custom PCB may be used. The custom PCB may be a non-production PCB, i.e., used for test purposes only, and may include contacts electrically connected to pins on the BGA component for accessing the pins.

DESCRIPTION OF EMBODIMENTS

Figure 1:
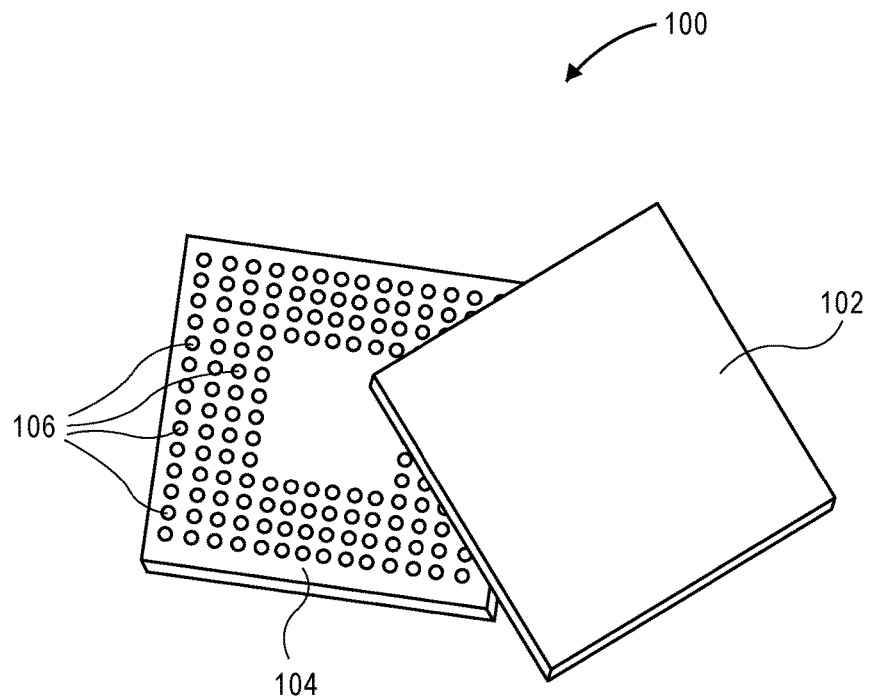
FIG. 1 illustrates a perspective view of a ball grid array (BGA) component, in accordance with an embodiment.

Flexible circuits mountable in a standoff region between a chip carrier, e.g., a ball grid array (BGA) component, and a printed circuit board (PCB) of a surface-mount package are described. In the following description, numerous specific details are set forth, such as flexible circuit architectures, in order to provide a thorough understanding of embodiments of the present invention. It will be apparent to one skilled in the art that embodiments of the present invention may be practiced without these specific details. In other instances, well-known features, such as specific semiconductor fabrication processes or surface-mount technology, are not described in detail in order to not unnecessarily obscure embodiments of the present invention. Furthermore, it is to be understood that the various embodiments shown in the accompanying figures are illustrative representations and are not necessarily drawn to scale.

Existing solutions for accessing pins of a BGA component for detecting and/or correcting a design fault include the use of custom PCBs having test hooks or access points electrically connected to the targeted pins. Such custom PCBs are themselves different boards than the PCBs that are used in production, and thus, if a design fault is bill of materials (BOM) interaction-related, the custom PCBs may not detect the design fault. Failure analysis requires deconstruction of the BGA component and/or the PCB, hand wiring, or solder bridging. These solutions, however, can be complicated and costly when numerous pins must be accessed to evaluate operational function.

In an aspect, a flex circuit allows access to pins of a chip carrier, e.g., a BGA component. The flex circuit may include an external test pad for monitoring or driving input/output (I/O) signals. The flex circuit may also be used to tie pins of the BGA component together, e.g., to short an I/O pin to a supply or ground pin. In an embodiment, the flex circuit includes a substrate having one or more dielectric film layers, and several holes through the dielectric film layers laterally inward from a perimeter of the substrate. The flex circuit may include a conductive lead extending through the substrate from a first end, e.g., the external test pad, at the perimeter of the substrate to a second end within a contact hole in the substrate. The flex circuit may include a second conductive lead extending through the substrate from a third end within the contact hole, to a fourth end within a second contact hole in the substrate. The flex circuit may be mounted on a BGA component such that respective solder balls are received within the contact holes of the substrate. The solder balls may be electrically connected to the conductive leads, and thus, the solder balls may be electrically connected to the external test pad through the conductive leads. Accordingly, the pins of the BGA component may be accessed electrically from the test pad. More particularly, electrical signals may be received from or driven to the pins to monitor and/or correct the pins through the flex circuit. Thus, the flex circuit provides a low-cost and uncomplicated solution to access numerous pins to evaluate operational function of the BGA component.

In an aspect, a surface-mount package allows for detecting and/or correcting a design fault after a BGA component of the surface-mount package is mounted on a PCB. In an embodiment, the surface-mount package includes a BGA component having several solder balls extending from a bottom surface of a package substrate. The surface-mount package may include a flex circuit coupled to the BGA component. For example, a solder ball of the BGA component may extend through a contact hole in a substrate of the flex circuit, and the solder ball may be electrically connected and attached to a conductive lead extending from the contact hole to an external test pad laterally outward from the BGA component. The solder ball may be mounted on, and attached to, a contact pad of the PCB to capture the flex circuit within a standoff region between the BGA component and the PCB. Thus, the solder ball in the contact hole, and any other pin of the BGA component that is electrically connected to the external test pad through conductive leads, may be accessed for monitoring and/or design fault correction.

Referring to FIG. 1, a perspective view of a ball grid array (BGA) component is illustrated in accordance with an embodiment. The illustration, in fact, includes two chip carriers oriented differently to provide top and bottom views of the component. A chip carrier, such as a BGA component 100, may include a top package portion 102, e.g., a plastic cap, over a package substrate 104, e.g., a ceramic or laminate substrate. BGA component 100 may include several pins, e.g., several solder balls 106, arranged in a ball field. The ball field may include a solder ball array, i.e., solder balls 106 arranged on package substrate 104 in a grid pattern. In an embodiment, the grid pattern includes solder balls 106 uniformly spaced within several rows and columns. For example, solder balls 106 may be located in a coordinate grid system having a pitch of 500 micron between each adjacent solder ball. Solder balls 106 arranged in the grid pattern may cover essentially all of a surface of package substrate 104, or as shown, portions of the surface may be depopulated, e.g., a central rectangular region on the surface may not include solder balls 106.

Figure 2:
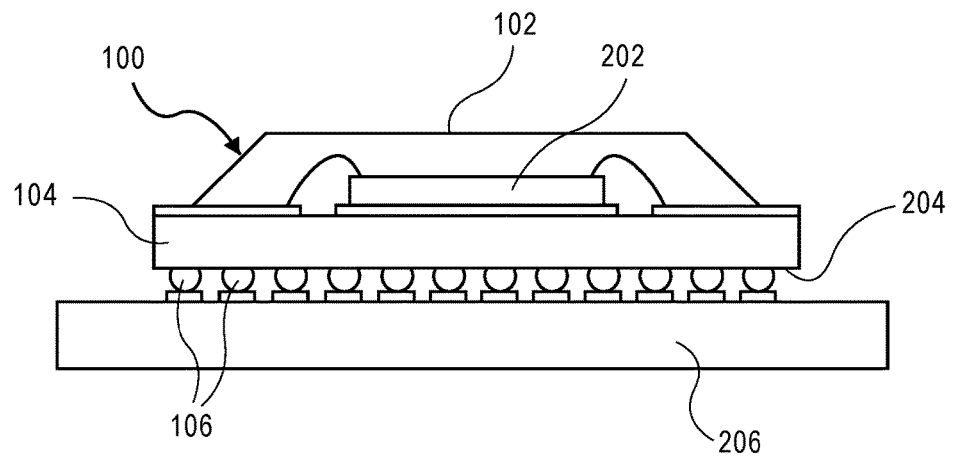
FIG. 2 illustrates a sectional view of a BGA component, in accordance with an embodiment.

Referring to FIG. 2, a sectional view of a BGA component is illustrated in accordance with an embodiment. Top package portion 102 may form a shell above package substrate 104. More particularly, top package portion 102 may be overmolded on package substrate 104 to enclose an integrated circuit 202 within BGA component 100. Solder balls 106 may extend from a bottom surface 204 of package substrate 104. Each solder ball may be essentially spherical, and include a diameter. By way of example, solder balls 106 may include a ball diameter in a range of 200-600 microns, e.g., 250 microns or 500 microns. In an embodiment, a manufacturing process used to deposit solder balls 106 on package substrate 104 is highly repeatable, and thus, the ball diameter of solder balls 106 may have a tolerance within a range of several microns. Each solder ball may be electrically connected to integrated circuit 202 to provide an electrical function. For example, solder balls 106 near a center of package substrate 104 may be used as power/ground pins, and solder balls 106 near a periphery of package substrate 104 may be used as signal pins for I/O. As described further below, solder balls 106 may be mounted and attached to a circuit board 206, e.g., a motherboard or another printed circuit board of a computer.

Figure 3:
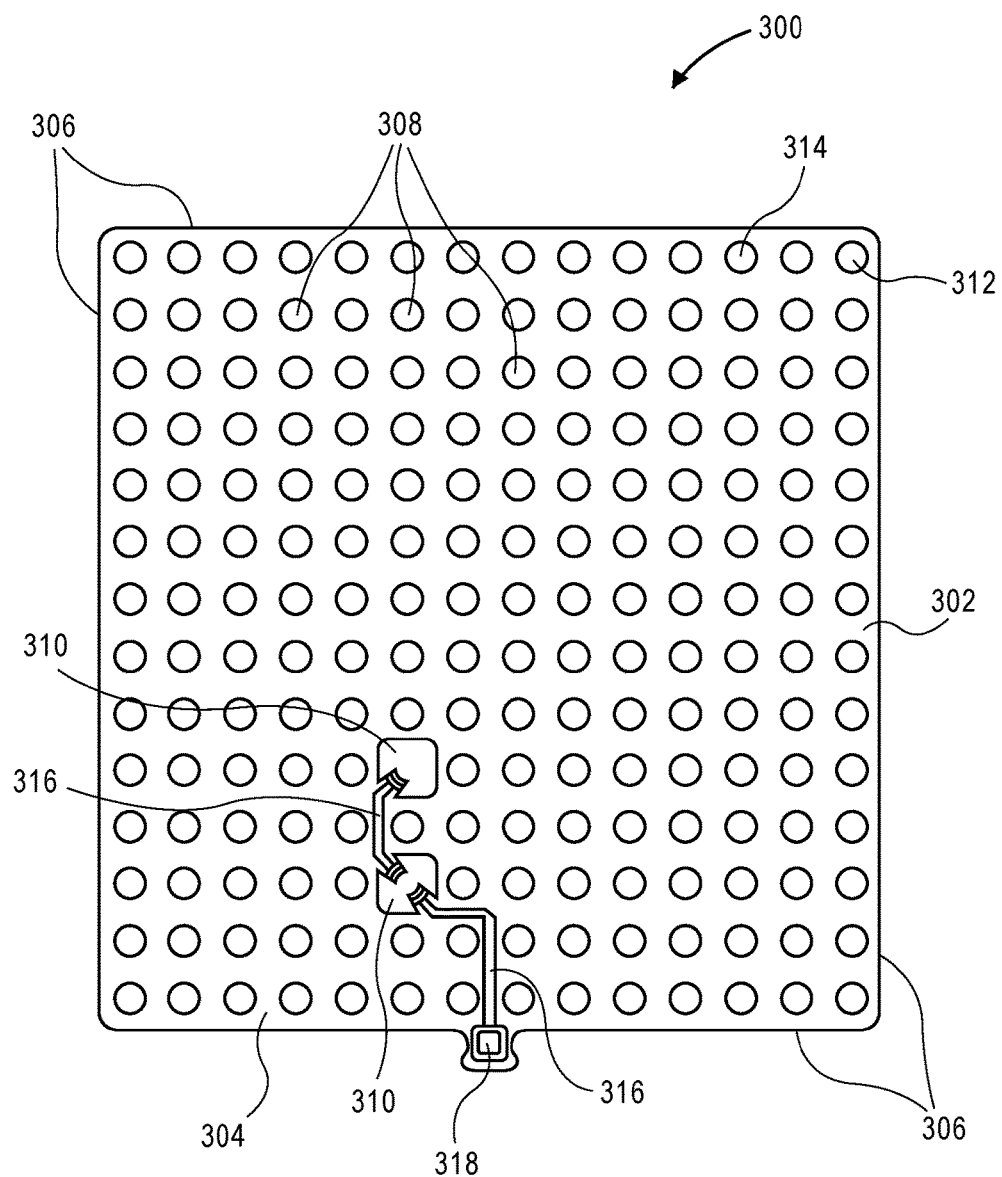
FIG. 3 illustrates a plan view of a flex circuit for accessing pins of a BGA component, in accordance with an embodiment.

Referring to FIG. 3, a plan view of a flex circuit for accessing pins of a BGA component is illustrated in accordance with an embodiment. A flex circuit 300 may be used to access solder balls 106 located laterally inward from a periphery of package substrate 104. Flex circuit 300 may include a flex substrate 302 having one or more dielectric film layers 304. Dielectric film layers 304 may include outer edges defining a perimeter 306 of flex substrate 302. In an embodiment, several holes 308 are formed through flex substrate 302. For example, one or more contact hole 310, retaining hole 312, or receiving hole 314, are formed through dielectric film layers 304 laterally inward from perimeter 306. Holes 308 of flex circuit 300 may be sized and configured for different purposes, as described below. Holes 308 may be arranged in a grid pattern matching the ball field of BGA component 100 such that solder balls 106 of BGA component 100 are received and/or retained within respective holes 308 when flex circuit 300 is mounted on BGA component 100.

In an embodiment, flex circuit 300 includes one or more conductive leads 316 extending through flex substrate 302 between respective terminal ends. For example, a conductive lead 316 may extend from a test pad 318 near perimeter 306 of flex substrate 302 to a contact hole 310, or a conductive lead 316 may extend between separate contact holes 310. More particularly, conductive leads 316 may provide electrical interconnects between two or more solder balls 106 of BGA component 100 received within respective holes 308 of flex circuit 300, or conductive leads may provide electrical interconnects between such solder ball(s) and an external test pad.

Figure 4:
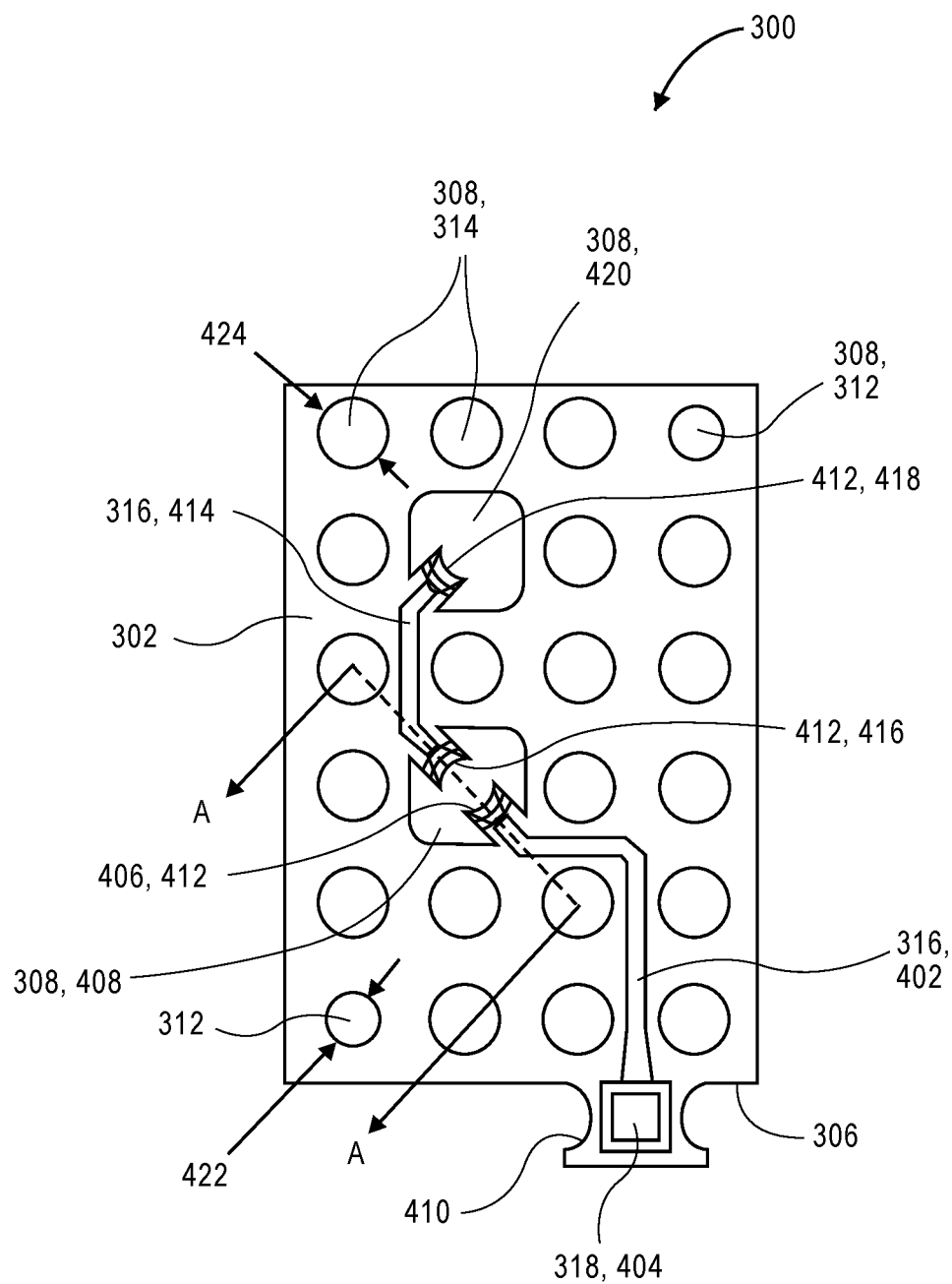
FIG. 4 illustrates a plan view of a flex circuit for access pins of a BGA component, in accordance with an embodiment.

Referring to FIG. 4 a flex circuit for accessing pins of a BGA component is illustrated in accordance with an embodiment. Flex circuit 300 may be configured to have a same shape and size as bottom surface 204 of package substrate 104. For example, flex circuit 300 may include holes 308 to receive substantially all of the solder balls 106 extending from bottom surface 204 (FIG. 3). In an embodiment, however, flex circuit 300 may be shaped and sized to cover only a portion of bottom surface 204. For example, flex circuit 300 may include holes 308 in a grid pattern having 4 columns and 6 rows (FIG. 4). Thus, a shape and size of flex circuit 300 may be selected to accommodate a predetermined number of BGA component pins. For example, flex circuit 300 may include holes 308 and/or conductive leads 316 to allow access to 30% or less of the BGA component pins. In an embodiment, flex circuit 300 provides access to pins located along the periphery of BGA component 100.

In an embodiment, a first conductive lead 402 extends through flex substrate 302 from a first end 404 at perimeter 306 of flex circuit 300 to a second end 406 within a first contact hole 408 of flex substrate 302. First end 404 of first conductive lead 402 may include test pad 318 located on a tab 410 extending laterally outward from perimeter 306. For example, test pad 318 may be a conductive surface of first conductive lead 402 exposed through a top or bottom layer of flex substrate 302. That is, one or more of a top surface or a bottom surface of conductive lead 316 may be exposed at first end 404 next to perimeter 306. A portion of first conductive lead 402 may similarly be exposed within first contact hole 408 to provide a ball contact 412. A ball contact 412 may be defined as a conductive portion of a conductive lead 316 used to electrically connect to a solder ball received within a contact hole 310. Accordingly, test pad 318 at first end 404 may be electrically connected to ball contact 412 at second end 406 through first conductive lead 402.

Flex circuit 300 may include a second conductive lead 414 extending through flex substrate 302 from a third end 406 within first contact hole 408, to a fourth end 418 within a second contact hole 420. Third end 406 and fourth end 418 of a second conductive lead 414 may provide respective ball contacts 412 used to electrically connect to solder balls 106 received within respective contact holes 310. For example, third end 416 may provide a ball contact 412 to electrically connect to a solder ball 106 received within first contact hole 408, and fourth end 418 may provide a ball contact 412 to electrically connect to a solder ball 106 received within second contact hole 420.

Figure 5:
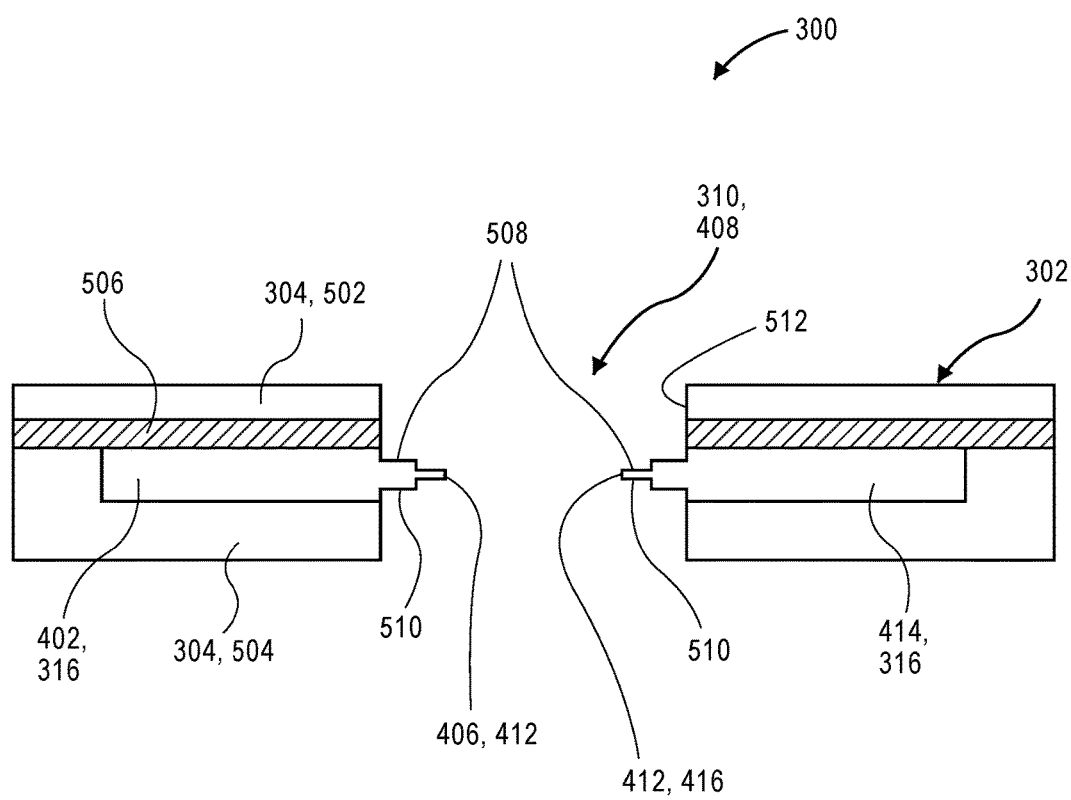
FIG. 5 illustrates a cross-sectional view, taken about line A-A of FIG. 4, of a contact hole of a flex circuit, in accordance with an embodiment.

Referring to FIG. 5, a cross-sectional view, taken about line A-A of FIG. 4, of a contact hole of a flex circuit is illustrated in accordance with an embodiment. Flex substrate 302 of flex circuit 300 may include several layers. For example, a top layer of flex substrate 302 may include a first dielectric film layer 304, which may be referred to as a cover film 502. Similarly, a bottom layer of flex substrate 302 may include a second dielectric film layer 304, which may be referred to as a base film 504. In an embodiment, cover film 502 and base film 504 may each have a thickness in a range of 10 to 30 micron. For example, base film 504 may include a polyimide material layer having a thickness of 25 micron, and cover film 502 may include a polyimide material layer having a thickness of 12.5 micron. Portions of cover film 502 and base film 504 may be attached to each other by an intermediate layer, e.g., an adhesive layer 506. For example, adhesive layer 506 may have a thickness of 5 to 15 micron, e.g., 12.5 micron. Conductive leads 316 of flex circuit 300 may extend between cover film 502, base film 504, and/or adhesive layer 506, and thus, may add marginally to the thickness of flex circuit 300 where they are located. In an embodiment, conductive leads 316 include copper strips having a thickness between 15 to 20 micron, e.g., 17.5 micron. Thus, a total thickness of flex circuit 300 may be in a range of 50 to 75 micron. As described below, the laminate structure of flex circuit 300 allows flex substrate 302 to fit between components of a surface-mount package (such as BGA component 100 mounted on a PCB) without adding to the overall height of the surface-mount package. Furthermore, this is achieved without adding additional interconnects, such as interposers, between the BGA component 100 and the PCB.

In an embodiment, conductive material, e.g., copper, of the conductive leads 316 is exposed within contact holes 310 of flex circuit 300 to provide ball contacts 412. For example, a top surface 508 and a bottom surface 510 of first conductive lead 402 may be exposed at second end 406 within first contact hole 408. Similarly, top surface 508 and bottom surface 510 of second conductive lead 414 may be exposed at third end 416 within first contact hole 408. Conductive leads 316 may be similarly exposed within other contact holes 310 of flex circuit 300. For example, top surface 508 and bottom surface 510 of second conductive lead 414 may be exposed within second contact hole 420 spaced apart from first contact hole 408. Accordingly, one or more exposed conductive lead 316 within a contact hole 310 may provide ball contacts 412 to electrically connect to a solder ball received within the contact hole 310.

A portion of conductive lead 316 exposed within contact hole 310 may vary in length and/or thickness. For example, top surface 508 or bottom surface 510 of conductive lead 316 within contact hole 310 may be stepped, as shown in FIG. 5. The stepped of the exposed portion of conductive lead 316 may be achieved, for example, by using an ablation laser to remove material from flex substrate 302 to a first depth at the first step and to a second depth at the second step. The ablation laser may furthermore remove an entire thickness of flex substrate 302 within the central region between first conductive lead 402 and second conductive lead 414. Accordingly, a cutout wall 512 may be formed around first contact hole 408. Cutout wall 512 may include laterally exposed portions of the various layers of flex substrate 302. Furthermore, conductive leads 316 of flex circuit 300 may extend from cutout wall 512 into contact holes 310 to respective terminal ends, e.g., first conductive lead 402 may extend from cutout wall 512 into first contact hole 408 to second end 406.

A structure, e.g., a profile and length, of exposed portions of conductive leads 316 within contact holes 310 may influence a pressure applied to solder balls 106 by ball contacts 412 when solder balls 106 are received within contact holes 310. Such pressure ensures that flex circuit 300 remains intact on BGA component 100 until solder reflow process, and that upon solder reflow processing, when the received solder ball liquefies a solder joint is formed between the reflowed solder balls and the conductive leads 316. Thus, a shape and profile of conductive lead 316 extending from cutout wall 512 into contact hole 310 may be selected to achieve a desired contact pressure against solder ball within contact hole 310. In an embodiment, a distance between ends of adjacent conductive leads 316 within contact hole 310 is less than a diameter of solder ball 106. For example, the distance between second end 406 of first conductive lead 402 and third end 416 of second conductive lead 414 across first contact hole 408 may be between 75% to 90% of a diameter of solder ball, e.g., 80% of the solder ball diameter. Thus, solder ball received between first conductive lead 402 and second conductive lead 414 may be squeezed between second end 406 and third end 416.

Figure 6A:
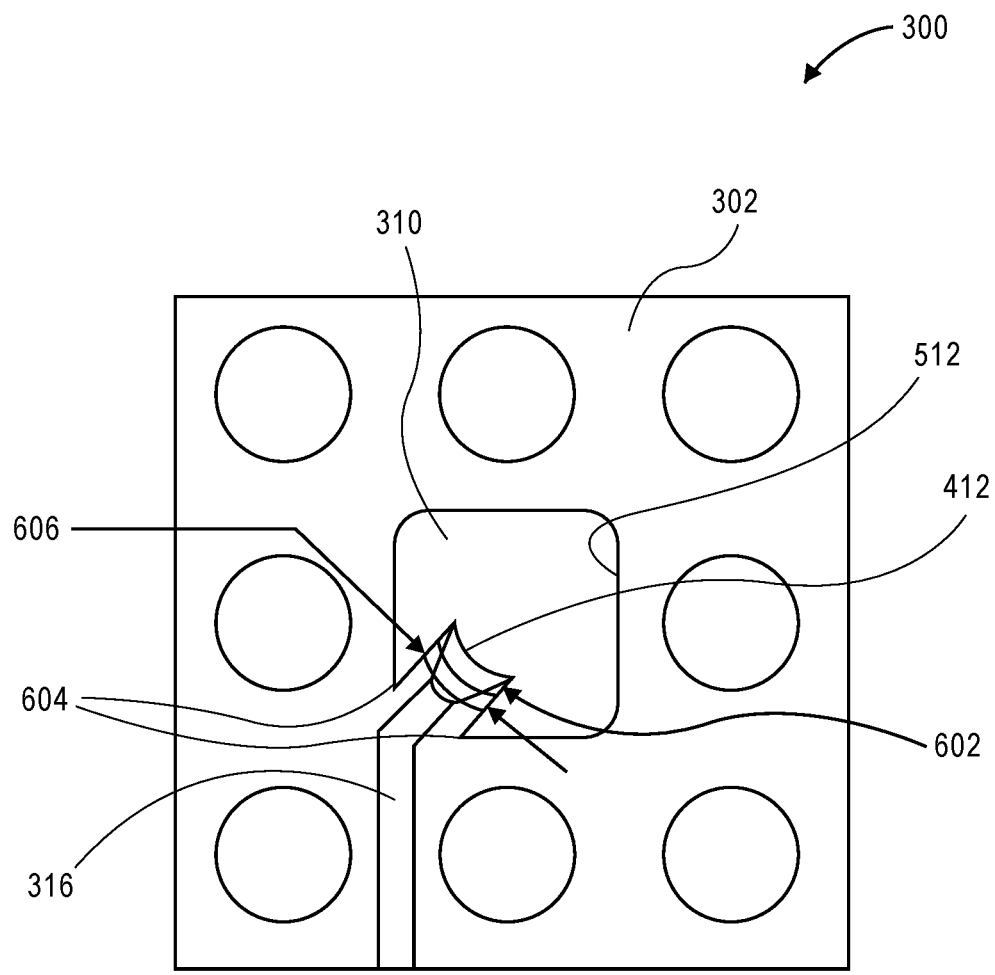
FIGS. 6A-6B illustrate plan views of a contact hole of a flex circuit, in accordance with an embodiment.

Referring to FIG. 6A, a plan view of a contact hole 310 of a flex circuit 300 is illustrated in accordance with an embodiment. A conductive lead 316 extending into a contact hole 310 formed within flex substrate 302 is shown here by way of example to illustrate a manner in which a ball contact tab 602 provides a level of stiffness to control pressure against a solder ball 106 received within contact hole 310. Ball contact tab 602 may be used in a contact hole 310 having a single ball contact 412, e.g., as second contact hole 420 is illustrated in FIG. 4, or may be used in another contact hole 310 of flex circuit 300, e.g., as in first contact hole 408 in FIG. 4. Thus, the following description is not intended to be limited to a particular contact hole 310 configuration or location. Ball contact tab 602 may be an arm feature extending from a base point 604 at cutout wall 512 to ball contact 412 at an end of conductive lead 316. In an embodiment, ball contact tab 602 includes a laminate structure having conductive lead 316 and one or more dielectric film layer 304 above or below conductive lead 316. Thus, ball contact tab 602 has a composite stiffness related to the individual stiffness of the constituent layers. As shown, ball contact tab 602 may include a tab width 606 between base point 604 and ball contact 412 within contact hole 310. For example, tab width 606 may be a same width from base point 604 to ball contact 412. Thus, a stiffness of ball contact 412 contributed by a tab width 606 dimension may be the same along the cantilevered length of ball contact tab 602.

Figure 6B:
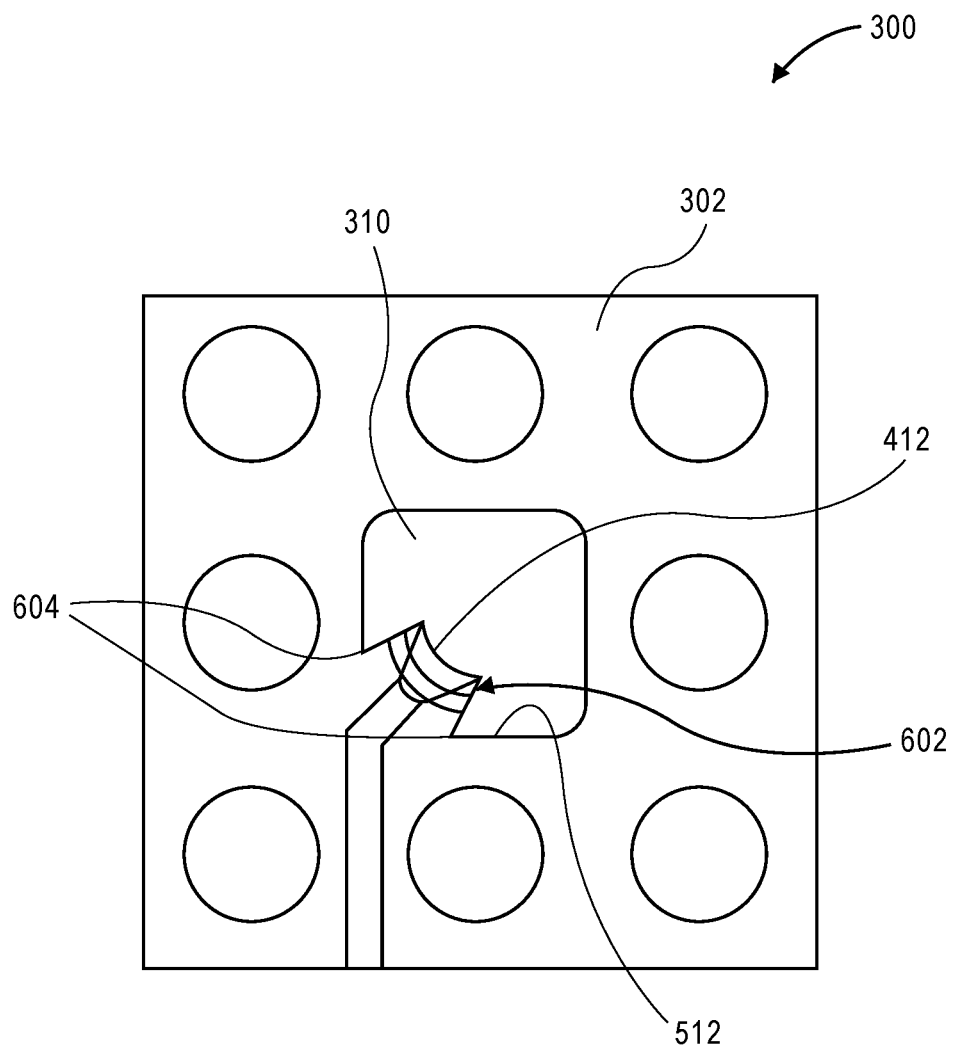

Referring to FIG. 6B, a plan view of a contact hole 310 of a flex circuit 300 is illustrated in accordance with an embodiment. In an embodiment, ball contact tab 602 includes a tab width that varies from base point 604 to ball contact 412. For example, ball contact tab 602 and/or conductive lead 316 extending through ball contact tab 602 may be wider at cutout wall 512 between base points 604 then at ball contact 412. In an embodiment, ball contact tab 602 includes a trapezoidal shape, and a conductive lead 316 extending through ball contact tab 602, e.g., first conductive lead 402, includes a tab width 606 at base points 604 that is wider than ball contact 412 of the conductive lead 316, e.g., second end 406 of first conductive lead 402. Alternatively, ball contact tab 602 may have a triangular shape with a triangular corner being at ball contact 412. Thus, a shape of ball contact tab 602 may be controlled to modulate stiffness of the ball contact arm feature extending into contact hole 310.

Referring again to FIG. 4, further description of holes of flex circuit 300 shall now be provided. Holes 308 of flex circuit 300 may include one or more retaining hole 312 adapted to receive corresponding solder balls 106 of BGA component 100 in a press fit. More particularly, retaining hole 312 may include a retaining hole diameter 422, and retaining hole diameter 422 may be smaller than a diameter of a corresponding solder ball 106. For example, retaining hole diameter 422 may be equal to a distance between second end 406 of first conductive lead 402 and third end 416 of second conductive lead 414. Thus, retaining hole diameter 422 may be smaller than a dimension of first contact hole 408, e.g., a width across first contact hole 408 between corners of cutout wall 512, or a distance between base points 604 of respective opposing ball contact tabs 602. In an embodiment, retaining hole diameter 422 is 75% to 90%, e.g., 80%, of the diameter of solder ball 106. Accordingly, flex substrate 302 may be placed on bottom surface 204 of BGA component 100 such that corresponding solder balls 106 are received in an interference fit within retaining hole 312. As such, flex substrate 302 may be retained on BGA component 100 when a cutout wall defining retaining holes 312 grips around an outer surface of solder balls 106. The grip may be further facilitated by shrinkage of flex circuit 300, e.g., caused during solder reflow processing when BGA component 100 is attached to flex circuit 300 using a solder reflow oven. In an embodiment, retention of flex circuit 300 on BGA component 100 is further facilitated by applying a pressure sensitive adhesive between bottom surface 204 of BGA component 100 and flex circuit 300.

Still referring to FIG. 4, holes of flex circuit may include one or more receiving hole adapted to loosely receive a corresponding solder ball of BGA component. More particularly, receiving hole 314 may have a receiving hole diameter 424 that is larger than a diameter of a corresponding solder ball 106. For example, receiving hole diameter 424 may be 10% to 25%, e.g., 15%, larger than the diameter of solder ball 106. Thus, solder ball 106 may be received within receiving hole 314 in a non-interference fit. Given that receiving hole diameter 424 may be larger than a ball diameter of solder ball 106, it will be appreciated that receiving hole diameter 424 may be larger than retaining hole diameter 422. Conversely, receiving hole diameter 424 may be smaller than a dimension of contact hole 310. For example, receiving hole diameter 424 may be less than a dimension across first contact hole 408 between corners of cutout wall 512, or a distance between base points 604 of respective opposing ball contact tabs 602. As such, a cutout wall defining receiving hole 314 may conform more closely to solder balls 106 than cutout wall 512 defining cutout holes 308.

Figure 7:
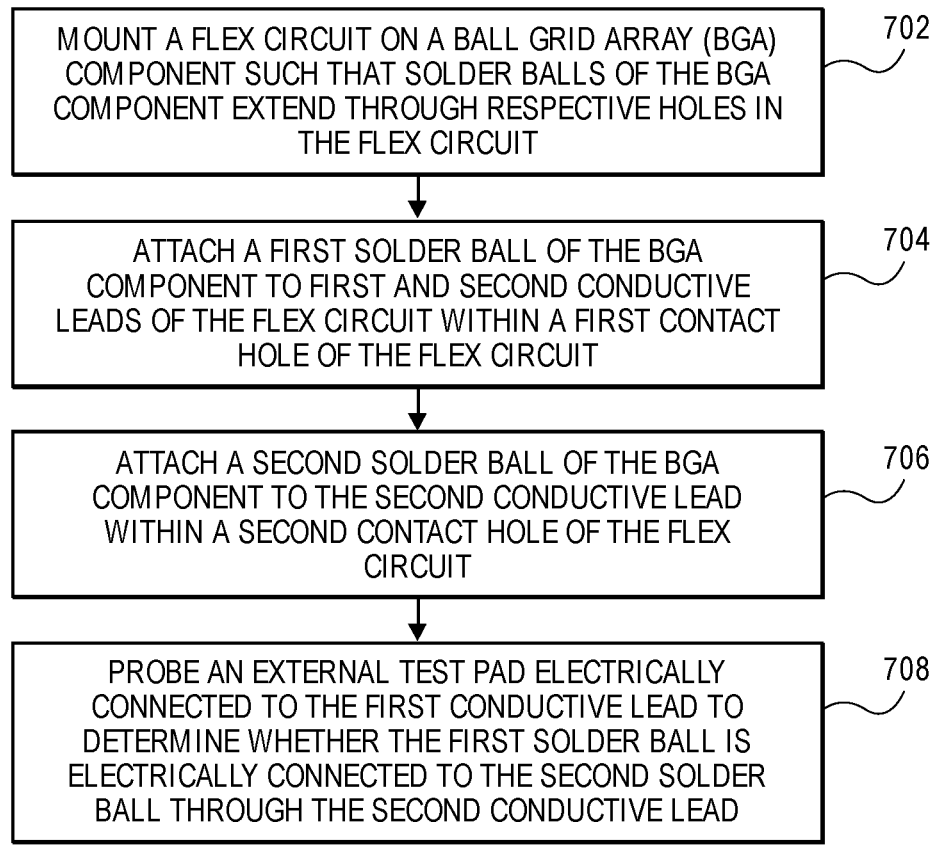
FIG. 7 illustrates a flowchart of a method of mounting a flex circuit on a BGA component, in accordance with an embodiment.

A structure of flex circuit 300 is described above, and it shall now be appreciated that flex circuit 300 is adapted to be mounted on BGA component 100, and more specifically, adapted to receive and electrically connect to solders balls 106 of BGA component 100. A structure and a method of fabricating a surface-mount package 812 having flex circuit 300 mounted on BGA component 100 is described below. Referring now to FIG. 7, a flowchart of a method of mounting a flex circuit 300 on a BGA component 100 is illustrated in accordance with an embodiment. Operations of the method are described below in relation to structures illustrated in FIG. 8.

Figure 8:
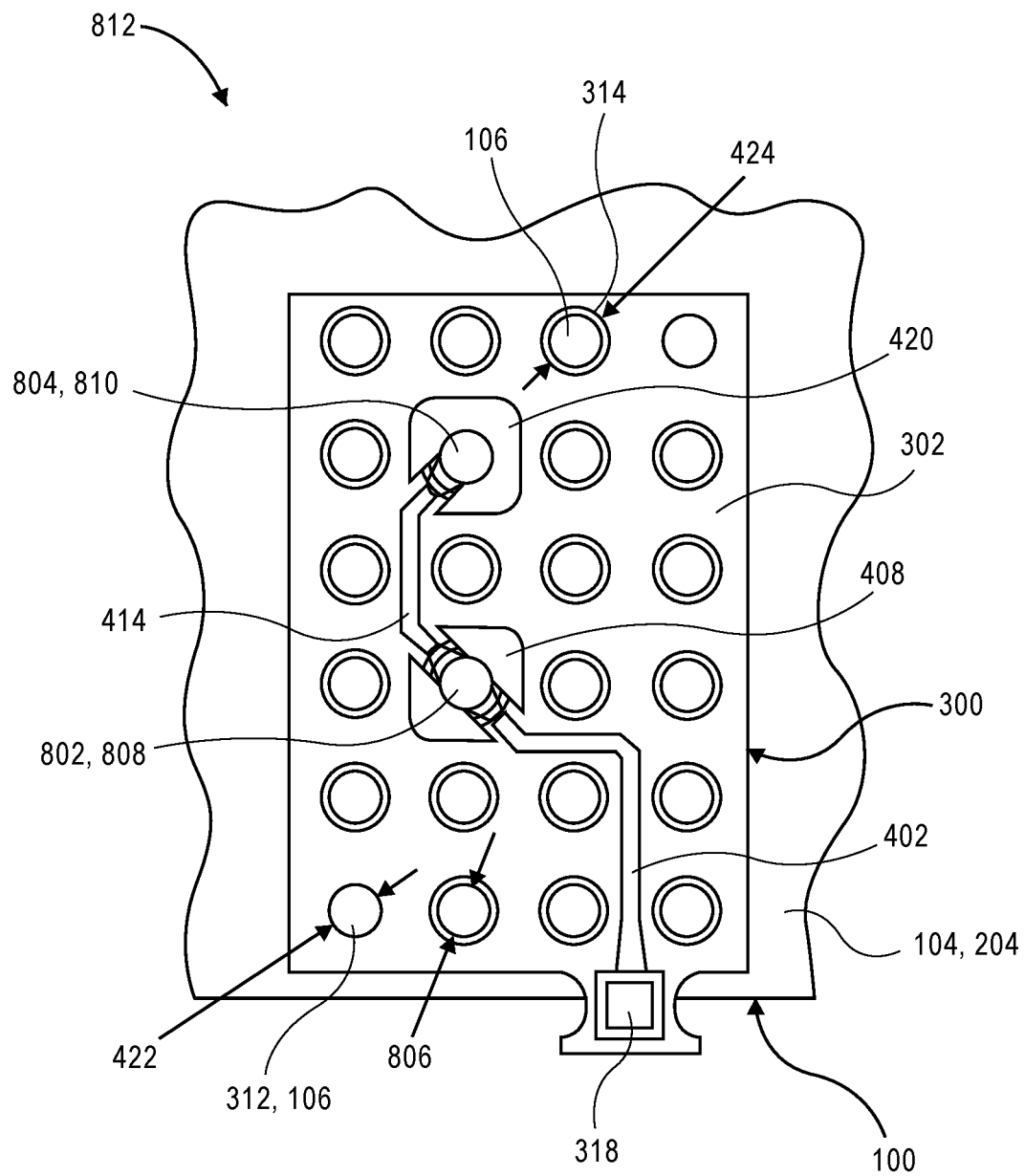
FIG. 8 illustrates a plan view of a flex circuit mounted on a BGA component, in accordance with an embodiment.

At operation 702, flex circuit 300 is mounted on BGA component 100. More particularly, flex circuit 300 may be mounted on BGA component 100 such that solder balls 106 package substrate 104 of BGA component 100 extend from bottom surface 204 through respective holes 308 in flex substrate 302. Referring to FIG. 8, a plan view of a flex circuit 300 mounted on a BGA component 100 is illustrated in accordance with an embodiment. As shown, a first solder ball 802 may extend through first contact hole 408, and a second solder ball 804 may extend through second contact hole 420. In an embodiment, first conductive lead 402 of flex circuit 300 contacts first solder ball 802 within first contact hole 408.

At operation 704, first conductive lead 402 may be attached to first solder ball 802. Attachment may be achieved, e.g., during a solder reflow process. Accordingly, a solder joint may be formed between first conductive lead 402 and first solder ball 802. Alternatively, conductive lead 402 may be attached to first solder ball 802 using other processes, such as adhesive bonding or welding processes. In an embodiment, the attachment may be through a press fit formed between ball contacts 412 of flex circuit 300 and first solder ball 802. The press fit may be formed during mounting of flex circuit 300 on BGA component 100, resulting from the interference fit between ball contacts 412 and first solder ball 802 as described above. Thus, first conductive lead 402 may be physically fixed relative to first solder ball 802 and/or electrically connected to first solder ball 802.

First conductive lead 402 may extend through flex substrate 302 from first solder ball 802 to test pad 318 located laterally outward from BGA component 100. More particularly, test pad 318 may be laterally outward of a sidewall of package substrate 104 to allow an operator to contact test pad 318 laterally outward from bottom surface 204 of BGA component 100. At operation 704, first solder ball 802 may also be attached to second conductive lead 414. For example, first solder ball 802 may be pressed between ball contacts 412 of first conductive lead 402 and second conductive lead 414 during the solder reflow process, and thus, the process may attach first solder ball 802 to second conductive lead 414 within first contact hole 408. Thus, second conductive lead 414 may extend from first solder ball 802 within first contact hole 408 through flex substrate 302 into second contact hole 420.

At operation 706, second solder ball 804 of BGA component 100 may be attached to second conductive lead 414 within second contact hole 420 of flex circuit 300. Attachment between second conductive lead 414 and second solder ball 804 may be completed during a same solder reflow process used to attach first solder ball 802 to first and second conductive leads 402, 414. Thus, second solder ball 804 may be attached to second conductive lead 414 within second contact hole 420 in a single solder reflow process. As such, a solder joint may be formed between first and second conductive leads 402, 414 and second solder ball 804. Alternatively, conductive leads 402, 414 may be attached to second solder ball 804 using other processes, such as adhesive bonding or welding processes. In an embodiment, the attachment may be through a press fit formed between ball contacts 412 of flex circuit 300 and second solder ball 804. The press fit may be formed during mounting of flex circuit 300 on BGA component 100, resulting from the interference fit between ball contacts 412 and second solder ball 804 as described above. Thus, conductive leads 402, 414 may be physically fixed relative to second solder ball 804 and/or electrically connected to second solder ball 804.

After mounting flex circuit 300 on BGA component 100 (operation 702), one or more solder balls 106 may be retained within a corresponding retaining holes 312. As shown, retaining hole diameter 422 may equal a ball diameter 806 of solder balls 106 after mounting. That is, solder balls 106 may have ball diameters 806 larger than retaining hole diameter 422, and thus, solder balls 106 may press against flex substrate 302 causing retaining hole diameter 422 to equal the solder ball diameter 806 in an interference fit. It is contemplated that the solder reflow process used to electrically connect solder balls 106 to conductive leads 316 may also result in shrinkage of flex substrate 302 that further contributes to the press fit and retention of flex circuit 300 by solder balls 106. In an embodiment, retaining holes 312 are located to correspond to non-critical to function (NCTF) pins of BGA component 100. For example, corner balls on BGA component 100 may be redundant power or redundant ground pins 810, which are commonly referred to as NCTF pins. The use of these pins to retain flex circuit 300 on BGA component 100 may reduce the likelihood that flex circuit 300 could interfere with existing reliability of BGA component 100.

Still referring to FIG. 8, as described above, several solder balls 106 may be received within corresponding receiving holes 314 in substrate. For example, receiving holes 314 may include a receiving hole diameter 424 larger than ball diameter 806 of solder balls 106. As such, solder balls 106 may be received within receiving holes 314 in a non-interference fit. The non-interference fit may reduce the likelihood that flex circuit 300 could interfere with existing reliability of BGA component 100.

At operation 708, test pad 318 may be probed, e.g., using electrical testing equipment. For example, an electrical signal may be monitored from, and or driven into, test pad 318 for debug, test, failure analysis, etc., purposes. The external test pad 318 may be electrically connected to first conductive lead 402, and thus, to first solder ball 802 attached to ball contact 412 of first conductive lead 402. Similarly, test pad 318 may be electrically connected to second solder ball 804 through ball contact 412 of second conductive lead 414, which is also attached to first solder ball 802. Thus, test pad 318 may be probed to determine whether first solder ball 802 is electrically connected to second solder ball 804 through second conductive lead 414.

In an embodiment, first solder ball 802 is a signal pin 808 of BGA component 100. For example, first solder ball 802 may be a pin used to run a class test on BGA component 100 with discrete I/O. By contrast, second solder ball 804 may be a ground pin 810 of BGA component 100. Thus, test pad 318 may be probed to determine whether signal pin 808 is electrically connected to ground pin 810. More particularly, by electrically connecting signal pin 808 to ground pin 810 through second conductive lead 414, the pins may be hardwired. Thus, by way of example, in a case where signal pin 808 is a floating pin, signal pin 808 may be tied to ground pin 810 to ground the floating pin, and such shorting/grounding may be verified by probing test pad 318. Such grounding of signal pin 808 may be used as a security feature, allowing signal pin 808 to be tested, and then after testing, grounded to ground pin 810 such that a customer is unable to access signal pin 808 when BGA component 100 is mounted on a corresponding PCB.

In FIG. 8, test pad 318 is shown accessible on an underside of flex circuit 300, i.e., test pad 318 is exposed when surface-mount package 812 is viewed in a direction toward bottom surface 204 of package substrate 104. Test pad 318 may also, however, be accessible on a top side of flex circuit 300. For example, test pad 318 may be a top surface 508 portion of first conductive lead 402 that is exposed through an opening in an upper dielectric film layer 304, e.g., cover film 502, and a bottom surface 510 portion that is exposed through an opening in a lower dielectric film layer 304, e.g., base film 504. Thus, test pad 318 may be accessed by a probe of an electrical tool and/or test pad 318 may be electrically connected to a mounting pad or lead on a surface of a corresponding PCB.

The combination of flex circuit 300 coupled to, e.g., mounted on and/or attached to, BGA component 100 may be referred to as a surface-mount package 812. Surface-mount package 812 may include the same structure as described above. For example, second conductive lead 414 may be described as including third end 416 and fourth end 418, i.e., third end 416 may be electrically connected to first solder ball 802 within first contact hole 408 and fourth end 418 may be electrically connected to second solder ball 804 within second contact hole 420. Thus, redundant description of the individual components of surface-mount package 812 are avoided here for the sake of clarity, however, one skilled in the art would understand that surface-mount package 812 may include the combined structure of BGA component 100 and flex circuit 300. Furthermore, one skilled in the art would understand that surface-mount package 812 may further include a PCB, and BGA component 100 may be mounted on PCB with flex circuit 300 captured between BGA component 100 and PCB of surface-mount package 812.

Figure 9:
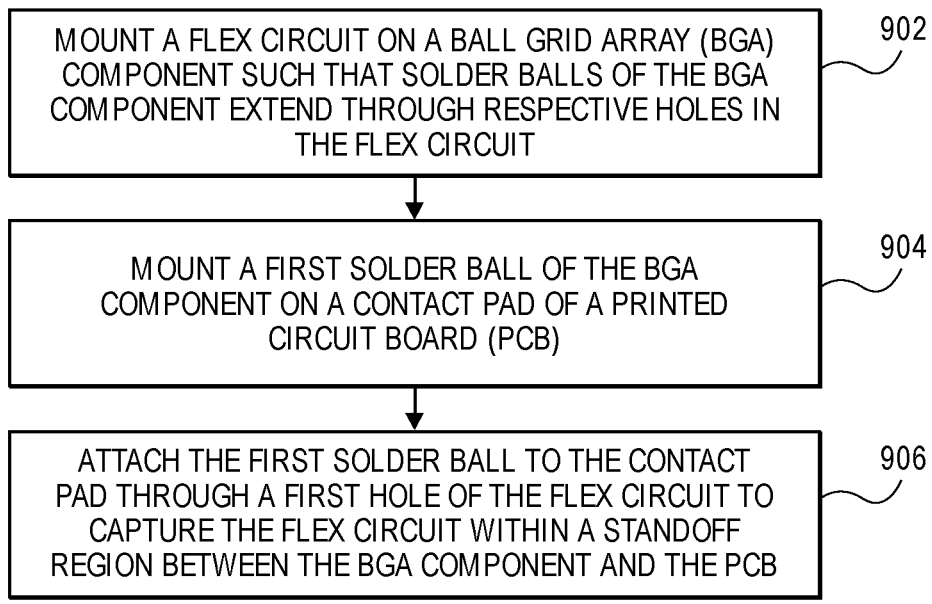
FIG. 9 illustrates a flowchart of a method of capturing a flex circuit between a BGA component and a printed circuit board (PCB), in accordance with an embodiment.

A structure and a method of fabricating a surface-mount package 812 having BGA component 100 mounted on PCB with flex circuit 300 captured therebetween is described below. Referring to FIG. 9, a flowchart of a method of capturing a flex circuit between a BGA component and a PCB is illustrated in accordance with an embodiment. Operations of the method are described below in relation to structures illustrated in other FIG. 10.

At operation 902, flex circuit 300 may be mounted on BGA component 100 such that solder balls 106 of BGA component 100 extend through respective holes 308 in flex circuit 300. Such mounting may be performed in the manner described above with respect to FIGS. 7-8.

Figure 10:
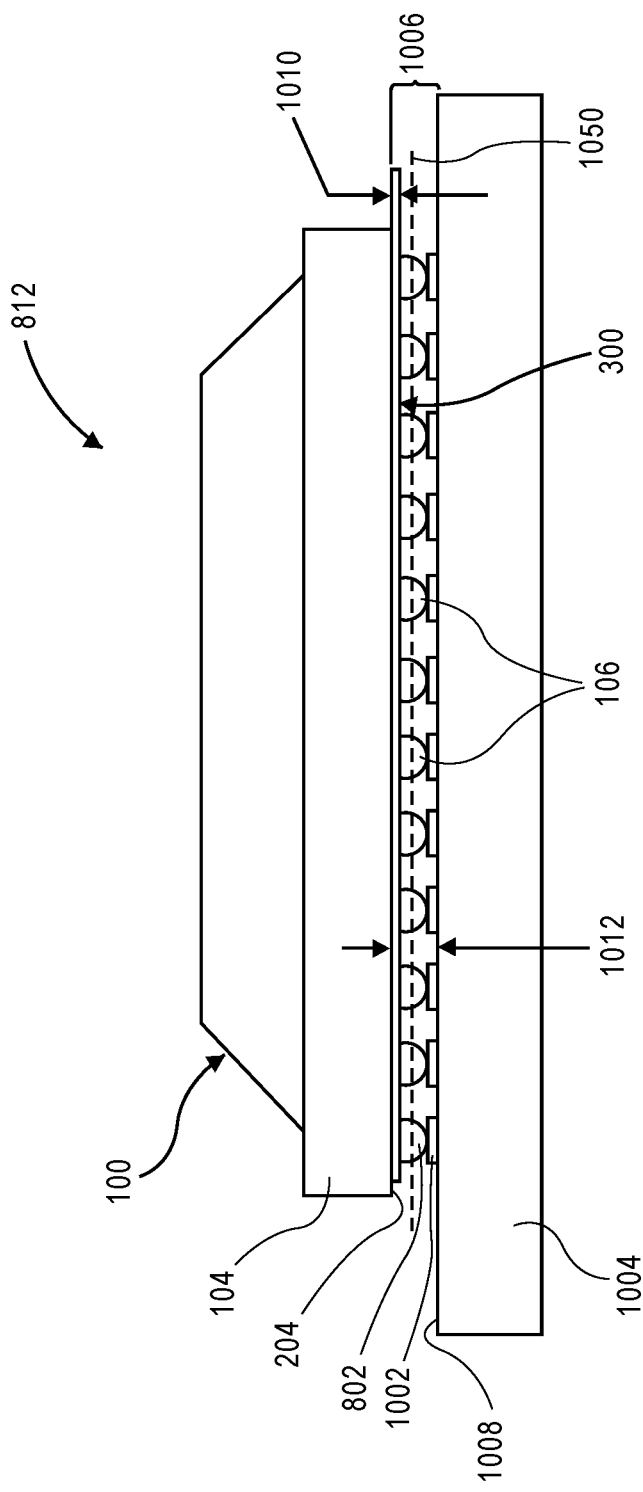
FIG. 10 illustrates a side view of a flex circuit captured between a BGA component and a PCB, in accordance with an embodiment.

Referring to FIG. 10, a side view of a flex circuit captured between a BGA component and a PCB is illustrated in accordance with an embodiment. Solder balls 106 extending from package substrate 104 of BGA component 100 through corresponding holes 308 in flex circuit 300 may be mounted on corresponding electrical contacts of a PCB 1004. For example, at operation 904, first solder ball 802 of BGA component 100 may be mounted on a corresponding contact pad 1002 of PCB 1004. Thus, a standoff region 1006 may be defined between bottom surface 204 of package substrate 104 and a top surface 1008 of PCB 1004.

At operation 906, solder balls 106 of BGA component 100 may be attached to PCB 1004. For example, first solder ball 802 may be attached to contact pad 1002 through a hole 308 in flex circuit 300. The hole 308 may be receiving hole 314, retaining hole 312, or contact hole 310, as described above. An attachment between first solder ball 802 and contact pad 1002 may be formed using known surface mount technology and chip mount reflow processes. Thus, an electrical connection between first solder ball 802 and contact pad 1002 may be formed and a column of solder material may pass between bottom surface 204 and top surface 1008 through the corresponding hole 308 in flex circuit 300. Accordingly, flex circuit 300 may be captured within standoff region 1006 between BGA component 100 and PCB 1004. Flex circuit 300 may be in-plane with the ball field of BGA component 100. In an embodiment, several solder balls 106 may be attached to corresponding contact pads 1002 through corresponding holes 308 in flex circuit 300 such that movement of flex circuit 300 is resisted by the reflowed pins and flex circuit 300 is securely retained between BGA component 100 and PCB 1004.

In an embodiment, capturing flex circuit 300 between BGA component 100 and PCB 1004 does not add to an overall height of surface-mount package 812. More particularly, a thickness 1010 of flex circuit 300 may be less than a height 1012 of standoff region 1006 to allow flex circuit 300 to fit within the space normally provided between the components of surface-mount package 812. Height 1012 may be a distance between bottom surface 204 of BGA component 100 and top surface 1008 of PCB 1004. In an embodiment, height 1012 of standoff region 1006 may be essentially equal to ball diameter 806 of solder balls 106, e.g., in a range of 200-600 microns. By way of example, the distance defining height 1012 may be less than 50% to 75% of the distance defining thickness 1010. For example, flex substrate 302 of flex circuit 300 may have thickness 1010 not greater than half of height 1012 between bottom surface 204 and top surface 1008, and thus, flex circuit 300 may reside between bottom surface 204 and a midplane 1050 of ball diameter 806 of first solder ball 802. In an embodiment, thickness 1010 of flex circuit 300 is less than 25% of ball diameter 806 of first solder ball 802 and/or height 1012 of standoff region 1006.

Figure 11:
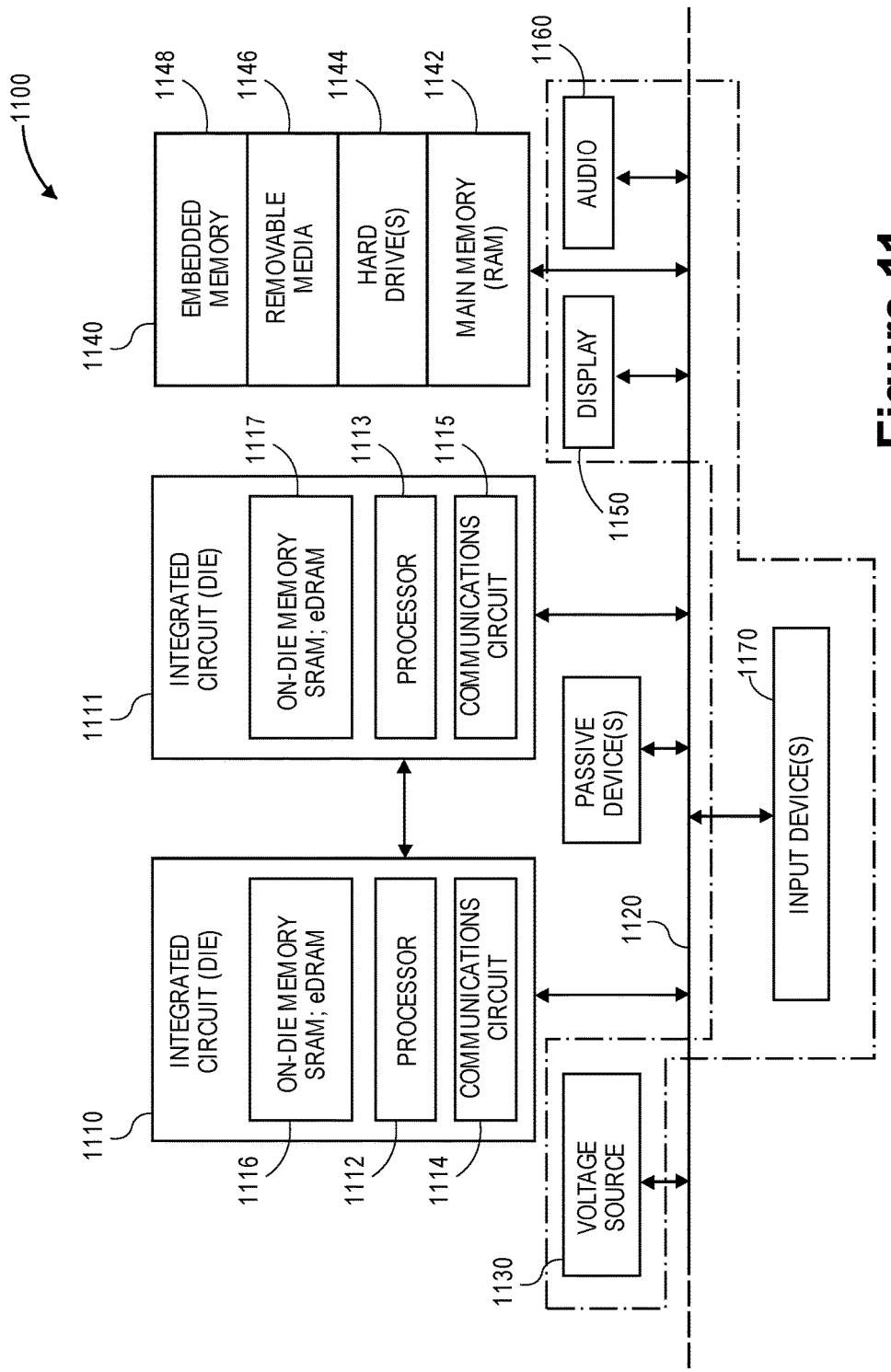
FIG. 11 is a schematic of a computer system, in accordance with an embodiment.

FIG. 11 illustrates a schematic of a computer system, in accordance with an embodiment. The computer system 1100 (also referred to as the electronic system 1100) as depicted can embody a flex circuit for accessing pins of a chip carrier, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the integrated circuit 1110 includes, or is coupled with, a flex circuit for accessing pins of a chip carrier, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including in a surface-mount package having a flex circuit for accessing pins of a chip carrier, according to any of the several disclosed embodiments and their equivalents, an electronic system, a computer system, one or more methods of fabricating an integrated circuit, and one or more methods of fabricating an electronic assembly that includes a surface-mount package having a flex circuit for accessing pins of a chip carrier, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed embodiments and their equivalents. A foundation substrate may be included, as represented by the dashed line of FIG. 11. Passive devices may also be included, as is also depicted in FIG. 11.

Embodiments of flexible circuits mountable in a standoff region between a chip carrier, e.g., a ball grid array component, and a printed circuit board of a surface-mount package are described above. Such flexible circuits may provide a low-cost and uncomplicated solution to access numerous pins of the BGA component to evaluate operational function of the BGA component. Furthermore, such flexible circuits may allow access to the pins of the BGA component when the BGA component is mounted on the PCB for monitoring and/or design fault correction of the surface-mount package.

In an embodiment, a flex circuit includes a flex substrate including one or more dielectric film layers. The flex substrate has a perimeter and includes several holes through the dielectric film layers laterally inward from the perimeter. The flex circuit includes a conductive lead extending through the flex substrate from a first end at the perimeter to a second end within a first contact hole of the holes. One or more of a top surface or a bottom surface of the conductive lead are exposed within the first contact hole.

In one embodiment, the flex circuit includes a second conductive lead extending through the flex substrate from a third end within the first contact hole to a fourth end within a second contact hole of the several holes. One or more of a second top surface or a second bottom surface of the second conductive lead are exposed within the first contact hole and the second contact hole.

In one embodiment, the flex substrate includes a cutout wall around the first contact hole, and the conductive lead extends from the cutout wall into the first contact hole to the second end.

In one embodiment, the conductive lead is wider at the cutout wall than at the second end.

In one embodiment, the several holes include a retaining hole having a retaining hole diameter smaller than a dimension across the first contact hole.

In one embodiment, the several holes include a receiving hole having a receiving hole diameter smaller than the dimension across the first contact hole and larger than the retaining hole diameter of the retaining hole.

In one embodiment, the several holes are arranged in a grid pattern.

In one embodiment, one or more of the top surface or the bottom surface of the conductive lead are exposed at the first end at the perimeter.

In an embodiment, a surface-mount package includes a ball grid array (BGA) component has several solder balls extending from a bottom surface of a package substrate. The surface-mount package includes a flex circuit coupled to the BGA component. The flex circuit includes a flex substrate including one or more dielectric film layers and several holes through the dielectric film layers. A first solder ball of the BGA component extends through a first contact hole of the flex substrate. A conductive lead extends through the flex substrate to a second end electrically connected to the first solder ball within the first contact hole.

In one embodiment, a second solder ball of the BGA component extends through a second contact hole of the flex substrate. The flex substrate includes a second conductive lead extending through the flex substrate from a third end electrically connected to the first solder ball within the first contact hole to a fourth end electrically connected to the second solder ball within the second contact hole.

In one embodiment, each of the several solder balls have a ball diameter. A distance between the second end of the first conductive lead and the third end of the second conductive lead is less than the ball diameter.

In one embodiment, the flex substrate includes a cutout wall around the first contact hole. The conductive lead extends from the first cutout wall to the first solder ball.

In one embodiment, the conductive lead is wider at the cutout wall than at the second end.

In one embodiment, the flex substrate includes a retaining hole having a retaining hole diameter smaller than the ball diameter. A third solder ball of the BGA component extends through the retaining hole of the substrate.

In an embodiment, a method includes mounting a flex circuit on a ball grid array (BGA) component. The flex circuit includes several holes through a flex substrate and the BGA component includes several solder balls extending from a bottom surface of a package substrate. A first solder ball extends through a first contact hole of the several holes. A second solder ball extends through a second contact hole of the several holes. A conductive lead of the flex circuit contacts the first solder ball within the first contact hole. The method includes attaching the first solder ball to the conductive lead. The conductive lead extends through the flex substrate from the first solder ball to a test pad disposed laterally outward from the BGA component.

In an embodiment, the flex circuit includes a second conductive lead extending from the first solder ball within the first contact hole to the second solder ball within the second contact hole. The method further includes attaching the first solder ball to the second conductive lead within the first contact hole, and attaching the second solder ball to the second conductive lead within the second contact hole.

In an embodiment, the first solder ball is a signal pin of the BGA component, and the second solder ball is a ground pin of the BGA component.

In an embodiment, the method includes probing the test pad to determine whether the signal pin is electrically connected to the ground pin.

In an embodiment, the method includes mounting the first solder ball on a contact pad of a printed circuit board (PCB). The method includes attaching the first solder ball to the contact pad through the first contact hole to capture the flex circuit within a standoff region between the BGA component and the PCB.

In an embodiment, the standoff region includes a height between the bottom surface of the BGA component and a top surface of the PCB. The height is at least twice a thickness of the flex substrate of the flex circuit.

What is claimed is:

1. A flex circuit, comprising:
   a flex substrate including one or more dielectric film layers, wherein the flex substrate has a perimeter and includes a plurality of holes through the dielectric film layers laterally inward from the perimeter; and
   a conductive lead extending through the flex substrate from a first end at the perimeter to a second end within a first contact hole of the plurality of holes, wherein one or more of a top surface or a bottom surface of the conductive lead are exposed within the first contact hole, the first contact hole extending in a first direction through the flex substrate, and the conductive lead along a second direction of the flex substrate, the second direction orthogonal to the first direction.

2. The flex circuit of claim 1 further comprising a second conductive lead extending through the flex substrate from a third end within the first contact hole to a fourth end within a second contact hole of the plurality of holes, wherein one or more of a second top surface or a second bottom surface of the second conductive lead are exposed within the first contact hole and the second contact hole.

3. The flex circuit of claim 2, wherein the flex substrate includes a cutout wall around the first contact hole, and wherein the conductive lead extends from the cutout wall into the first contact hole to the second end.

4. The flex circuit of claim 3, wherein the conductive lead is wider at the cutout wall than at the second end.

5. The flex circuit of claim 1, wherein the plurality of holes include a retaining hole having a retaining hole diameter smaller than a dimension across the first contact hole.

6. The flex circuit of claim 5, wherein the plurality of holes include a receiving hole having a receiving hole diameter smaller than the dimension across the first contact hole and larger than the retaining hole diameter of the retaining hole.

7. The flex circuit of claim 6, wherein the plurality of holes are arranged in a grid pattern.

8. The flex circuit of claim 7, wherein one or more of the top surface or the bottom surface of the conductive lead are exposed at the first end at the perimeter.

9. A surface-mount package, comprising:
   a ball grid array (BGA) component having a plurality of solder balls extending from a bottom surface of a package substrate; and a flex circuit coupled to the BGA component, the flex circuit including a flex substrate including one or more dielectric film layers and a plurality of holes through the dielectric film layers, wherein a first solder ball of the BGA component extends through a first contact hole of the flex substrate, and a conductive lead extending through the flex substrate from a first end to a second end electrically connected to the first solder ball within the first contact hole.

10. The surface-mount package of claim 9, wherein a second solder ball of the BGA component extends through a second contact hole of the flex substrate, wherein the flex substrate includes a second conductive lead extending through the flex substrate from a third end electrically connected to the first solder ball within the first contact hole to a fourth end electrically connected to the second solder ball within the second contact hole.

11. The surface-mount package of claim 10, wherein each of the plurality of solder balls have a ball diameter, and wherein a distance between the second end of the first conductive lead and the third end of the second conductive lead is less than the ball diameter.

12. The surface-mount package of claim 11, wherein the flex substrate includes a cutout wall around the first contact hole, and wherein the conductive lead extends from the first cutout wall to the first solder ball.

13. The surface-mount package of claim 12, wherein the conductive lead is wider at the cutout wall than at the second end.

14. The surface-mount package of claim 10, wherein the flex substrate includes a retaining hole having a retaining hole diameter smaller than the ball diameter, and wherein a third solder ball of the BGA component extends through the retaining hole of the substrate.

15. A flex circuit, comprising:
a flex substrate including one or more dielectric film layers, wherein the flex substrate has a perimeter and includes a plurality of holes through the dielectric film layers laterally inward from the perimeter;
a conductive lead extending through the flex substrate from a first end at the perimeter to a second end within a first contact hole of the plurality of holes, wherein one or more of a top surface or a bottom surface of the conductive lead are exposed within the first contact hole; and
a second conductive lead extending through the flex substrate from a third end within the first contact hole to a fourth end within a second contact hole of the plurality of holes, wherein one or more of a second top surface or a second bottom surface of the second conductive lead are exposed within the first contact hole and the second contact hole, wherein the flex substrate includes a cutout wall around the first contact hole, and wherein the conductive lead extends from the cutout wall into the first contact hole to the second end.

16. The flex circuit of claim 15, wherein the conductive lead is wider at the cutout wall than at the second end.

17. The flex circuit of claim 15, wherein the plurality of holes include a retaining hole having a retaining hole diameter smaller than a dimension across the first contact hole.

18. The flex circuit of claim 17, wherein the plurality of holes include a receiving hole having a receiving hole diameter smaller than the dimension across the first contact hole and larger than the retaining hole diameter of the retaining hole.

19. The flex circuit of claim 18, wherein the plurality of holes are arranged in a grid pattern.

20. The flex circuit of claim 19, wherein one or more of the top surface or the bottom surface of the conductive lead are exposed at the first end at the perimeter.

* * * * *